(12) United States Patent
Fukuda et al.

(10) Patent No.: US 8,048,725 B2
(45) Date of Patent: Nov. 1, 2011

(54) METHOD OF FORMING PATTERN AND METHOD OF PRODUCING ELECTRONIC ELEMENT

(75) Inventors: Toshio Fukuda, Kanagawa (JP); Akihiro Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 223 days.

(21) Appl. No.: 12/593,841

(22) PCT Filed: Dec. 21, 2007

(86) PCT No.: PCT/JP2007/074694
§ 371 (c)(1),
(2), (4) Date: Sep. 29, 2009

(87) PCT Pub. No.: WO2008/129738
PCT Pub. Date: Oct. 30, 2008

(65) Prior Publication Data
US 2010/0221413 A1 Sep. 2, 2010

(30) Foreign Application Priority Data
Mar. 30, 2007 (JP) .................................. 2007-092179

(51) Int. Cl.
*H01L 21/84* (2006.01)
(52) U.S. Cl. .. 438/151; 438/780; 438/782; 257/E21.561
(58) Field of Classification Search .......... 438/151–166, 438/780, 782
See application file for complete search history.

(56) References Cited

U.S. PATENT DOCUMENTS

| | | | | |
|---|---|---|---|---|
| 7,718,465 B2 * | 5/2010 | Nomoto | .......................... | 438/99 |
| 2007/0026554 A1 * | 2/2007 | Nomoto | .......................... | 438/29 |

FOREIGN PATENT DOCUMENTS

| | | |
|---|---|---|
| JP | 11-058921 | 3/1999 |
| JP | 2001-225593 | 8/2001 |
| JP | 2005-128346 | 5/2005 |
| JP | 2005-246790 | 9/2005 |
| JP | 2006-045294 | 2/2006 |
| JP | 2006-156426 | 6/2006 |

OTHER PUBLICATIONS

International Search Report dated Mar. 30, 2007.

* cited by examiner

*Primary Examiner* — Richard A. Booth
(74) *Attorney, Agent, or Firm* — SNR Denton US LLP

(57) ABSTRACT

A method of forming a pattern and a method of producing an electronic element are characterized by including a first step of forming an electrically conductive film (D) by applying a liquid composition onto a first plate (10), and heating the first plate (10); a second step of forming an electrically conductive pattern (D') on the first plate (10) by pressing a second plate (20) having a projection-and-recess pattern on a surface side thereof onto a surface side of the first plate (10), on which the electrically conductive film (D) is formed, to transfer an unwanted pattern of the electrically conductive film (D) to top faces of projections (20*a*) of the second plate (20), thereby removing the unwanted pattern; and a third step of transferring the electrically conductive pattern (D') to a surface of a transfer-receiving substrate (30) by pressing the surface side of the first plate (10), on which the electrically conductive pattern (D') is formed, onto the surface of the transfer-receiving substrate (30), wherein the liquid composition contains a solvent having a vapor pressure of 133 Pa or less at a surface temperature of the heated first plate (10). These methods provide a method of forming a pattern and a method of producing an electronic element in which a state of a liquid-composition coating film is stabilized and a fine and precise pattern can be stably formed with good reproducibility.

4 Claims, 2 Drawing Sheets

(a)

(b)

(c)

(d)

METHOD OF FORMING PATTERN AND METHOD OF PRODUCING ELECTRONIC ELEMENT

TECHNICAL FIELD

The present invention relates to a method of forming a pattern and a method of producing an electronic element. More specifically, the present invention relates to a method of forming an electrically conductive pattern and a method of producing an electronic element using the same.

BACKGROUND ART

Various methods have been studied in order to efficiently form a fine and precise pattern on a glass substrate, a plastic substrate, or the like at a low cost. For example, a printing method has been disclosed in which a resin to be printed is applied onto the entire surface of a first plate called a blanket, a surface of which is coated with silicone rubber having detachability, and a second plate having a projection-and-recess pattern on a surface side thereof is then pressed onto the surface side of the first plate, on which the resin is provided, to transfer an unwanted pattern of the resin to top faces of projections of the second plate, thereby removing the unwanted pattern, and a resin pattern remaining on the surface of the first plate is transferred to a transfer-receiving substrate (refer to, for example, Japanese Unexamined Patent Application Publication No. 11-58921).

When a fine and precise pattern is formed using this printing method, it is necessary that a liquid composition used therein maintain an appropriate transfer characteristic of the liquid composition in each of the steps of applying the liquid composition onto a first plate, transferring an unwanted pattern of a liquid-composition coating film from the first plate to a second plate, and transferring a pattern from the first plate to the transfer-receiving substrate.

First, in the step of applying the liquid composition onto the first plate, in general, the surface of the first plate is formed of a material having detachability, and a thin, smooth, and uniform liquid-composition coating film must be formed on this surface having detachability. Accordingly, it is necessary to appropriately control physical property values of the liquid composition.

In addition, in the next step of transferring an unwanted pattern of the liquid-composition coating film from the first plate to the second plate, the liquid-composition coating film applied onto the first plate must be completely transferred with the pattern shape remaining as it is on the top faces of the projections of the second plate to be contacted. For this purpose, it is necessary that after the liquid composition is applied onto the first plate, the viscosity of the resulting liquid-composition coating film be appropriately increased, and the liquid-composition coating film on the first plate maintain an appropriate tackiness and cohesive property.

Furthermore, in the step of transferring to the transfer-receiving substrate, the patterned liquid-composition coating film remaining on the first plate must be completely transferred to the transfer-receiving substrate. For this purpose, it is necessary that the liquid-composition coating film after patterning be in an appropriate coating film state (dry state) suitable for transfer.

An example of an ink composition for preparing a color filter in which the viscosity value of an ink composition (liquid composition) used in printing, the surface energy thereof, and the vapor pressure value of a solvent are set to cope with these technical problems has been disclosed (refer to, for example, Japanese Unexamined Patent Application Publication No. 2005-128346).

DISCLOSURE OF INVENTION

However, Japanese Unexamined Patent Application Publication No. 2005-128346 does not describe the temperature during a step of printing. If this printing method is performed at room temperature, the dry state of a liquid-composition coating film on a first plate varies depending on the room temperature, and thus variations in the tackiness of the liquid-composition coating film are generated. Therefore, in the step of transferring an unwanted pattern from the first plate to a second plate, and in the step of transferring a pattern from the first plate to a transfer-receiving substrate, it is difficult to reliably transfer the patterns with good reproducibility. Accordingly, there is such a problem that defects may occur in a formed pattern.

Furthermore, in the physical properties of the liquid composition described in Japanese Unexamined Patent Application Publication No. 2005-128346, the vapor pressure of the solvent constituting the liquid composition is not sufficiently specified, and thus volatilization of the solvent from the liquid-composition coating film proceeds, and the liquid-composition coating film may not be maintained while having an appropriate tackiness and cohesive property. Accordingly, there is a problem that transfer of a pattern is not reliably performed.

In order to solve the problems described above, it is an object of the present invention to provide a method of forming a pattern and a method of producing an electronic element in which the state of a liquid-composition coating film is stabilized and a fine and precise pattern can be stably formed with good reproducibility.

In order to achieve the object described above, in a method of forming a pattern of the present invention, the following steps are sequentially performed. First, in a first step, a liquid-composition coating film is formed by applying a liquid composition onto a first plate, and a heat treatment is performed. Next, in a second step, a pattern is formed on the first plate by pressing a second plate having a projection-and-recess pattern on a surface side thereof onto a surface side of the first plate, on which the liquid-composition coating film is formed, to transfer an unwanted pattern of the liquid-composition coating film to top faces of projections of the second plate, thereby removing the unwanted pattern. Subsequently, in a third step, the pattern is transferred to a surface of a transfer-receiving substrate by pressing the surface side of the first plate, on which the pattern is formed, onto the surface of the transfer-receiving substrate. In addition, the liquid composition is characterized by containing a solvent having a vapor pressure of 133 Pa or less at a surface temperature of the first plate during the heat treatment.

According to the method of forming a pattern described above, in the first step, a liquid-composition coating film is formed by applying a liquid composition onto a first plate, and the first plate is heated. Therefore, a liquid-composition coating film in a state specified by the temperature of the heat treatment is stably formed. In addition, the liquid composition contains a solvent having a vapor pressure of 133 Pa or less at a surface temperature of the heated first plate. Accordingly, even when the heat treatment is performed, this solvent remains in the liquid-composition coating film, and thus the liquid-composition coating film is maintained while having a tackiness and cohesive property suitable for transfer. Accordingly, in the step of transferring an unwanted pattern from the first plate to the second plate, and in the step of transferring a pattern from the first plate to the transfer-receiving substrate, the patterns can be reliably transferred.

Furthermore, the method of producing an electronic element in the present invention is characterized in that the above-described method of forming a pattern is applied to a method of producing an electronic element. Accordingly, in the step of transferring an unwanted pattern from the first plate to the second plate and in the step of transferring a pattern from the first plate to the transfer-receiving substrate, the patterns can be reliably transferred.

As described above, according to a method of forming a pattern of the present invention and a method of producing an electronic element using the same, in the step of transferring an unwanted pattern from the first plate to the second plate and in the step of transferring a pattern from the first plate to the transfer-receiving substrate, the patterns can be reliably transferred, and therefore, a fine and precise pattern can be stably formed with good reproducibility. Accordingly, a fine electrode pattern of an electronic element can be formed by a printing method, and a process of producing an electronic element can be simplified.

BEST MODES FOR CARRYING OUT THE INVENTION

An embodiment of the present invention will now be described in detail on the basis of the drawings.

Figure 1:
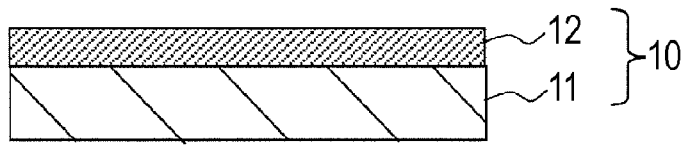
FIG. 1 includes production-process cross-sectional views (part 1) for illustrating a method of producing an electronic element according to an embodiment of the present invention.
Figure 1:
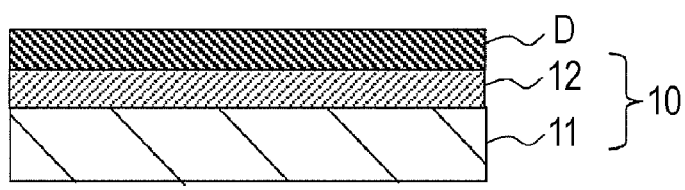
Figure 1:
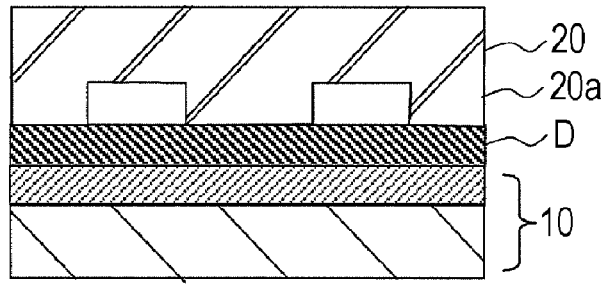
Figure 1:
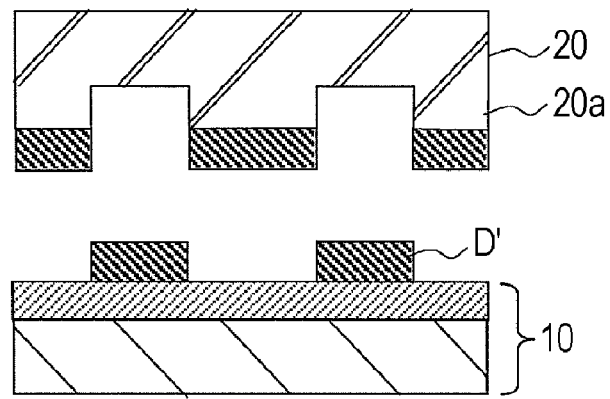

An example of a method of forming a pattern according to an embodiment of the present invention will be described with reference to production-process cross-sectional views of FIG. 1 using a method of producing an electronic element including a bottom gate/bottom contact-type thin-film transistor as an example. In this embodiment, the method of forming a pattern of the present invention is applied to a formation of source/drain electrodes of the thin-film transistor.

As shown in FIG. 1(a), a first plate 10 serving as a blanket is constituted by a flat plate including a glass substrate 11 and, for example, a polydimethylsilane (PDMS) layer 12 provided on the glass substrate 11. This first plate 10 is prepared by applying PDMS onto the glass substrate 11 by, for example, a spin-coating method, and then curing the PDMS by heat treatment, and the PDMS layer 12 is provided so that the surface side thereof is flat.

Here, the first plate 10 having a coating film thereon is heated in the subsequent step, and therefore, a heat source such as an oil heater is provided in the PDMS layer 12 of the first plate 10. Note that the heat source may not be provided in the first plate 10, and the first plate 10 may be heated by, for example, heating a processing atmosphere. In addition, an example in which the first plate 10 is a flat plate will be described here, but the first plate 10 may have a roll shape.

First, as shown in FIG. 1(b), a liquid composition in which electrically conductive particles composed of, for example, silver nanoparticles are dispersed in an organic solvent is applied onto the PDMS layer 12 of the first plate 10 by, for example, a Cap coating method to form an electrically conductive film D (liquid-composition coating film) having a thickness of, for example, 1 μm, and the first plate 10 is then heated. Note that this heating of the first plate 10 is performed from room temperature of, for example, 20° C. to in the range of 30° C. to 90° C., preferably in the range of 30° C. to 60° C. with the above-described heat source provided in the first plate 10. By this heating of the first plate 10, the dry state of the electrically conductive film D on the first plate 10 is maintained in a state specified by the heating temperature. Accordingly, variations in the dry state of the electrically conductive film D are suppressed as compared with a state at the room temperature.

Furthermore, the above liquid composition contains a solvent having a vapor pressure of 133 Pa or less at a surface temperature of the heated first plate 10. Accordingly, even when the first plate 10 is heated, this solvent remains in the electrically conductive film D, and thus the electrically conductive film D is maintained while having a tackiness and a cohesive property suitable for transfer.

Here, if the tackiness of the electrically conductive film D is too high, as described below, in a step of pressing a second plate having a projection-and-recess pattern to transfer an unwanted pattern of the electrically conductive film D to the top faces of projections of the second plate, adhesiveness of the electrically conductive film D to the first plate 10 is high, and the unwanted pattern is not readily transferred to the top faces of the projections of the second plate. In contrast, if the tackiness of the electrically conductive film D is too low, in the above step, an electrically conductive pattern cannot be allowed to remain on the first plate 10 with good dimensional controllability because the electrically conductive pattern may be partly removed together with the unwanted pattern adhered to the top faces of the projections of the second plate. Furthermore, if the cohesive property of the electrically conductive film D is too high, the film strength is high, and thus in the above step, the unwanted pattern is not readily transferred to the top faces of the projections of the second plate. In contrast, if the cohesive property of the electrically conductive film D is too low, in the above step, the electrically conductive film D may remain at positions where the electrically conductive film D on the first plate 10 should be removed.

Note that, here, the above-described heating of the first plate 10 is performed after the electrically conductive film D is formed, but the liquid composition may be applied while the first plate 10 is heated in advance.

Here, examples of the solvent having a vapor pressure of 133 Pa or less in the range of 30° C. to 90° C. at which the first plate 10 is heated include methyl benzoate having a vapor pressure of 133 Pa at 39° C., terpineol having a vapor pressure of 133 Pa at 53° C., benzyl alcohol having a vapor pressure of 133 Pa at 58° C., and tripropylene glycol having a vapor pressure of 133 Pa at 96° C. The above solvents may be used as a single solvent or used in combination of these.

Furthermore, it is sufficient that one or more solvents having a vapor pressure of 133 Pa or less at a surface temperature of the heated first plate 10 are contained in the above liquid composition, and solvents other than the above-mentioned solvents may be contained. As the solvents other than the above-mentioned solvents, besides water, polar solvents including ester solvents, alcohol solvents, and ketone solvents; and non-polar solvents can be used according to a printing property. Examples of the ester solvents include methyl acetate, ethyl acetate, and ethyl propionate. Examples of the alcohol solvents include ethanol, propanol, and isopropanol. Examples of the ketone solvent include acetone, methyl ethyl ketone, and methyl isobutyl ketone. Furthermore, examples of the non-polar solvents include hydrocarbon solvents such as pentane, hexane, heptane, octane, decane, dodecane, isopentane, isohexane, isooctane, cyclohexane, methylcyclohexane, and cyclopentane. Furthermore, aromatic solvents such as toluene, xylene, and mesitylene can also be preferably used.

Here, in the case where electrically conductive particles are contained in the liquid composition in an amount of 3 wt % to 50 wt %, in order that the electrically conductive film D exhibits a tackiness suitable for transfer, the amount of solvent having a vapor pressure of 133 Pa or less added to the liquid composition is preferably 3 wt % to 60 wt %, and further preferably 5 wt % to 40 wt %.

Note that, here, the liquid composition contains electrically conductive particles composed of silver nanoparticles, but besides silver, electrically conductive particles composed of gold, nickel, copper, or platinum can be used. In general, a coating surface treatment is performed on the surfaces of these electrically conductive particles using a polymer material of the like, and electrically conductive particles dispersed in water or an organic solvent are used. Furthermore, the liquid composition may contain other electrically conductive materials than the electrically conductive particles described above. Note that physical properties of the liquid composition may be controlled by incorporating a resin or a surfactant in the liquid composition in addition to the electrically conductive materials and solvents described above.

Here, in addition to the Cap coating method described above, examples of the method of applying the liquid composition include a roll coating method, a spray coating method, a dip coating method, a curtain flow coating method, a wire-bar coating method, a gravure coating method, an air knife coating method, a doctor blade coating method, a screen coating method, and a die coating method. The application method is preferably selected in accordance with the shape of the first plate 10 such as a roll shape, a flat shape, or the like. Among the above methods, the Cap coating method is preferable because it has a good application property.

Next, as shown in FIG. 1(c), a second plate 20 having a projection-and-recess pattern on a surface side thereof, the second plate 20 being composed of, for example, a glass plate, is pressed onto a surface side of the first plate 10 on which the electrically conductive film D is formed. The projection-and-recess pattern is formed so that a projection pattern is a reverse pattern of an electrically conductive pattern described below. By forming the projection-and-recess pattern of the second plate 20 by etching using an ordinary photolithography technique, a fine and precise projection-and-recess pattern can be formed.

Here, the surface of the second plate 20 is composed of a material having a surface tension lower than the surface tension of the surface of the first plate 10 so that the adhesiveness of the top faces of projections 20a of the second plate 20 to the electrically conductive film D is higher than the adhesiveness of the surface of the first plate 10 to the electrically conductive film D. Accordingly, as shown in FIG. 1(d), by pressing the second plate 20 onto the surface side of the first plate 10 on which the electrically conductive film D is formed, an unwanted pattern of the electrically conductive film D (see FIG. 1(c) described above) is transferred to the top faces of the projections 20a to form an electrically conductive pattern D' on the first plate 10. In this step, as described above, when the electrically conductive film D has an appropriate tackiness, the unwanted pattern is reliably transferred to the top faces of the projections 20a. Note that it is assumed that the unwanted pattern of the electrically conductive film D transferred to the top faces of the projections 20a is recovered and reused.

Figure 2:
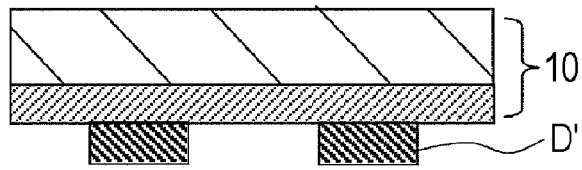
FIG. 2 includes production-process cross-sectional views (part 2) for illustrating the method of producing an electronic element according to the embodiment of the present invention.
Figure 2:
Figure 2:
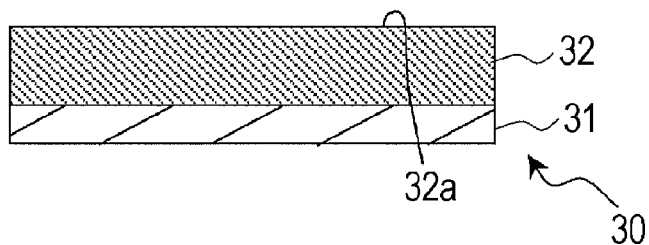
Figure 2:
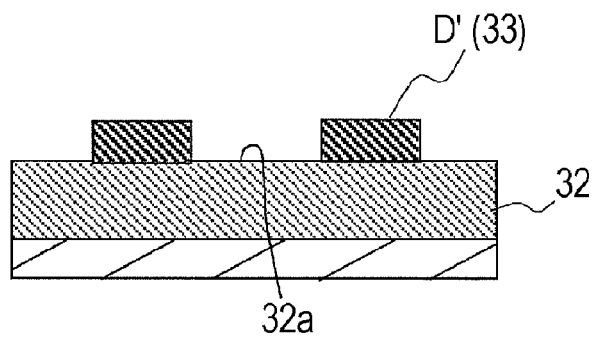
Figure 2:
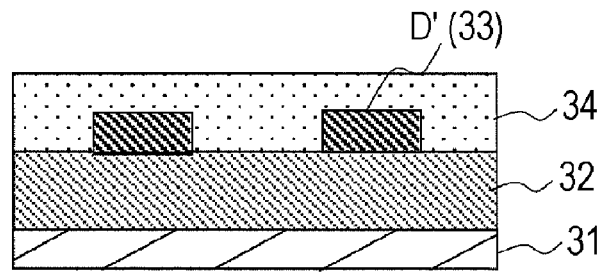

Subsequently, as shown in FIG. 2(e), a surface side of the first plate 10, on which the electrically conductive pattern D' is formed, is pressed onto a transfer-receiving surface of a transfer-receiving substrate 30. Here, the transfer-receiving substrate 30 has a structure in which an insulating film 32 composed of polyvinylphenol (PVP) is provided on a substrate 31 composed of a silicon substrate. Accordingly, a surface 32a of the insulating film 32 functions as the transfer-receiving surface. Here, it is assumed that by highly doping an impurity ion in the substrate 31 composed of a silicon substrate, the substrate 31 also functions as a gate electrode, and the insulating film 32 provided as an upper layer on the substrate 31 constitutes a gate insulating film.

Here, the insulating film 32 is composed of a material having a surface tension lower than the surface tension of the surface of the first plate 10 so that the adhesiveness of the surface 32a functioning as the transfer-receiving surface of the insulating film 32 to the electrically conductive pattern D' is higher than the adhesiveness of the surface of the first plate 10 to the electrically conductive pattern D'. Accordingly, as shown in FIG. 2(f), by pressing the surface side of the first plate 10, on which the electrically conductive pattern D' is formed, to the transfer-receiving surface of the transfer-receiving substrate 30, the electrically conductive pattern D' is transferred to the surface 32a of the insulating film 32. In this step, when the electrically conductive pattern D' has a tackiness suitable for transfer, the electrically conductive pattern D' is reliably transferred to the surface 32a of the insulating film 32.

This electrically conductive pattern D' becomes source/drain electrodes 33. Subsequently, the electrically conductive pattern D' is sintered by heating in, for example, an oven. Here, the film thickness of the electrically conductive pattern D' after sintering is 500 nm or less.

Subsequent steps are performed as in a normal process of producing a thin-film transistor. That is, as shown in FIG. 2(g), a semiconductor layer 34 composed of, for example, triisopropylsilylethynyl pentacene is formed on the insulating film 32 by, for example, a spin-coating method so as to cover the source/drain electrodes 33 composed of the electrically conductive pattern D'.

As described above, a bottom gate/bottom transistor-type thin-film transistor in which the insulating film (gate insulating film) 32, the source/drain electrodes 33, and the semiconductor layer 34 are stacked on the substrate (gate electrode) 31 in that order is produced.

According to the method of forming a pattern and the method of producing an electronic element using the same, the electrically conductive film D is formed by applying a liquid composition onto the first plate 10, and the first plate 10 is heated. Accordingly, the electrically conductive film D in a state specified by a heating temperature is stably formed. Furthermore, since the liquid composition contains a solvent having a vapor pressure of 133 Pa or less at a surface temperature of the heated first plate 10, the solvent remains in the electrically conductive film D even when the first plate 10 is heated. Accordingly, the electrically conductive film D is maintained while having a tackiness and cohesive property suitable for transfer. Consequently, in the step of transferring an unwanted pattern of the electrically conductive film D from the first plate 10 to the second plate 20, and in the step of transferring the electrically conductive pattern D' from the first plate 10 to the transfer-receiving substrate 30, the patterns can be reliably transferred. Accordingly, a fine and precise pattern can be stably formed with good reproducibility. Thus, a fine electrode pattern of an electronic element can be formed using a printing method, and a process of producing the electronic element can be simplified.

Note that in the embodiment described above, a description has been made of an example in which source/drain electrodes are formed. Alternatively, the present invention can be applied to, for example, a case where a gate electrode is formed on an insulating substrate. The transistor structure is not limited to the above-described bottom gate/bottom contact-type transistor structure, and the present invention can be applied also to a case where an electrode pattern having another transistor structure is formed. Furthermore, the present invention can be applied to the formation of an electrode pattern of not only a thin-film transistor but also other electronic elements such as a printed wiring board, an RF-ID tag, and various display substrates.

In addition, the present invention is not limited to a method of forming an electrically conductive pattern, and can be applied also to a method of forming an insulating pattern and a method of forming a semiconductor pattern. When the present invention is applied to a method of forming an insulating pattern, as a solute of a liquid composition, organic materials such as polyester resins, acrylic resins, epoxy resins, and melamine resins can be used alone or as a mixture. Furthermore, radical-type ultraviolet curable resins, cation-type ultraviolet curable resins, electron-beam curable resins, and the like can be appropriately used according to need. As a solvent, the same solvents as those described in the embodiment can be used.

Furthermore, when the present invention is applied to a method of forming a semiconductor pattern, as a solute of a liquid composition, for example, a soluble organic semiconductor material such as triisopropylsilylethynyl pentacene is used. As a solvent, the same solvents as those described in the embodiment can be used. For example, in the above embodiment, in the step of forming the semiconductor layer 34 described with reference to FIG. 2(*g*), an organic semiconductor layer may be pattern-formed by applying the present invention.

EXAMPLES

Furthermore, specific Examples of the present invention will now be described with reference to FIGS. 1 and 2 again.

Examples 1 to 5

As in the above embodiment, PDMS (manufactured by Dow Corning Corporation, trade name: SILPOT) was applied onto a glass substrate 11 with a spin coater, and the PDMS was cured by heat treatment to prepare a first plate 10 (blanket). Next, silver nanoparticles (average particle diameter: 10 nm) which had been surface-treated with oleic acid were dispersed in an amount of 5 wt % using solvents having the composition ratio shown in Table 1 to prepare a liquid composition. Each of the solvents of Examples 1 to 5 contains a solvent having a vapor pressure of 133 Pa or less at a surface temperature of the heated first plate 10. Subsequently, an electrically conductive film D was formed by applying the liquid composition onto the first plate 10, and the first plate 10 was then heated such that the temperature of the first plate 10 became the temperature shown in Table 1.

TABLE 1

| Solvent | Vapor pressure (Pa) | Example 1 | Example 2 | Example 3 | Example 4 | Example 5 |
|---|---|---|---|---|---|---|
| Temperature of first plate | | 30° C. | 39° C. | 50° C. | 55° C. | 90° C. |
| Electrically conductive particles Ag (wt %) | | 5 | 5 | 5 | 5 | 5 |
| Xylene | 865 (20° C.) | 75 | 35 | 85 | 55 | 90 |
| Decane | 33.3 (30° C.) | 20 | — | — | — | — |
| Methyl benzoate | 133 (39° C.) | — | 60 | — | — | — |
| Terpineol | 133 (53° C.) | — | — | 10 | — | — |
| Benzyl alcohol | 133 (58° C.) | — | — | — | 40 | — |
| Tripropylene glycol | 133 (96° C.) | — | — | — | — | 5 |
| Evaluation result | | ○ | ○ | ○ | ○ | ○ |

Meanwhile, a photoresist (manufactured by Kayaku Macrochem Corporation, trade name: SU-8) was applied onto a glass substrate with a spin coater so as to have a thickness of 5 μm, and exposed and developed to form a projection-and-recess pattern on a surface side thereof wherein a line and space (L/S)=5 μm (aspect ratio 1:1). Thus, a second plate 20 composed of a glass plate was prepared.

Subsequently, the second plate 20 was pressed onto a surface side of the first plate 10, on which the electrically conductive film D was formed, so that an unwanted pattern of the electrically conductive film D was transferred to projections 20a of the second plate 20 to remove the unwanted pattern. Thus, an electrically conductive pattern D' was formed on the first plate 10.

Meanwhile, a solution in which a cross-linking agent composed of a melamine-formaldehyde resin was added to a PVP resin solution (solvent: PGMEA (propylene glycol monomethyl ether acetate), concentration: 20 wt %) was applied onto a substrate 31 with a spin coater. Thus, a transfer-receiving substrate 30 having an insulating film 32 composed of PVP thereon was prepared. Next, the surface side of the first plate 10, on which the electrically conductive pattern D' was formed, was pressed onto a transfer-receiving surface 32a of the transfer-receiving substrate 30 to transfer the electrically conductive pattern D' to the surface of the insulating film 32. Subsequently, the electrically conductive pattern D' was fixed at 180° C. for one hour in an oven to sinter the silver nanoparticles, thus forming a wiring pattern having electrical conductivity.

As a result, it was confirmed that the electrically conductive pattern D' of L/S=5 μm was formed without problems (shown by O in Table 1 above).

Comparative Examples 1 to 5

Meanwhile, as Comparative Examples 1 to 5 relative to Examples 1 to 5 above, a wiring pattern of L/S=5 μm was formed as in Examples 1 to 5 except that solvents having the compositions shown in Table 2 were used as solvents in which the electrically conductive particles were dispersed as liquid compositions. Note that none of the solvents of Comparative Examples 1 to 5 contains a solvent having a vapor pressure of 133 Pa or less at a surface temperature of the heated first plate 10.

TABLE 2

| | | Comparative Example 1 | Comparative Example 2 | Comparative Example 3 | Comparative Example 4 | Comparative Example 5 |
|---|---|---|---|---|---|---|
| Temperature of blanket | | 30° C. | 30° C. | 40° C. | 50° C. | 80° C. |
| Electrically conductive particles Ag (wt %) | | 5 | 5 | 5 | 5 | 5 |
| Solvent | Vapor pressure (Pa) | | | | | |
| Xylene | 865 (20° C.) | 95 | — | — | — | — |
| n-Butanol | 1,330 (31° C.) | — | 95 | — | — | — |
| Anisole | 1,330 (43° C.) | — | — | 95 | 55 | — |
| Tetrahydrofurfuryl alcohol | 399 (50° C.) | — | — | — | 40 | — |
| Terpineol | 665 (80° C.) | — | — | — | — | 95 |
| Evaluation result | | X | X | X | X | X |

As a result, it was confirmed that volatilization of the solvent from the electrically conductive film D was significant, the pattern was not completely transferred to the second plate 20, and the wiring pattern of L/S=5 μm could not be formed (shown by x in Table 2).

The invention claimed is:

1. A method of forming a pattern characterized by comprising:
   a first step of forming a liquid-composition coating film by applying a liquid composition onto a first plate, and heating the first plate;
   a second step of forming a pattern on the first plate by pressing a second plate having a projection-and-recess pattern on a surface side thereof onto a surface side of the first plate, on which the liquid-composition coating film is formed, to transfer an unwanted pattern of the liquid-composition coating film to top faces of projections of the second plate, thereby removing the unwanted pattern; and
   a third step of transferring the pattern to a surface of a transfer-receiving substrate by pressing the surface side of the first plate, on which the pattern is formed, onto the surface of the transfer-receiving substrate,
   wherein the liquid composition contains a solvent having a vapor pressure of 133 Pa or less at a surface temperature of the heated first plate.

2. The method of forming a pattern according to claim 1, characterized in that
   the liquid composition contains an electrically conductive material, and
   in the first step, an electrically conductive film is formed by applying the liquid composition onto the first plate.

3. A method of producing an electronic element characterized by comprising:
   a first step of forming a liquid-composition coating film by applying a liquid composition onto a first plate, and heating the first plate;
   a second step of forming a pattern on the first plate by pressing a second plate having a projection-and-recess pattern on a surface side thereof onto a surface side of the first plate, on which the liquid-composition coating film is formed, to transfer an unwanted pattern of the liquid-composition coating film to top faces of projections of the second plate, thereby removing the unwanted pattern; and
   a third step of transferring the pattern to a surface of a transfer-receiving substrate by pressing the surface side of the first plate, on which the pattern is formed, onto the surface of the transfer-receiving substrate,
   wherein the liquid composition contains a solvent having a vapor pressure of 133 Pa or less at a surface temperature of the heated first plate.

4. The method of producing an electronic element according to claim 3, characterized in that
   the electronic element is a semiconductor device in which source/drain electrodes, a gate insulating film, and a gate electrode are stacked in that order or in an order reverse to this on a substrate and a semiconductor layer is provided on an upper layer side or a lower layer side of the source/drain electrodes,
   in the first step, an electrically conductive film is formed by applying the liquid composition containing an electrically conductive material onto the first plate, and the first plate is heated,
   in the second step, an electrically conductive pattern is formed on the first plate by pressing a second plate having a projection-and-recess pattern on a surface side thereof onto a surface side of the first plate, on which the electrically conductive film is formed, to transfer an unwanted pattern of the liquid-composition coating film to top faces of projections of the second plate, thereby removing the unwanted pattern, and in the third step, the source/drain electrodes or the gate electrode is formed by pressing the surface side of the first plate, on which the electrically conductive pattern is formed, onto a surface of a transfer-receiving substrate to transfer the electrically conductive pattern to the surface of the transfer-receiving substrate.

* * * * *